(12) United States Patent
Kim et al.

(10) Patent No.: US 7,462,904 B2
(45) Date of Patent: Dec. 9, 2008

(54) NON-VOLATILE MEMORY DEVICES AND METHODS OF FORMING THE SAME

(75) Inventors: Seong-Gyun Kim, Seongnam-si (KR); Ji-Hoon Park, Seoul (KR); Sang-Woo Kang, Seoul (KR); Sung-Woo Park, Gunpo-si (KR)

(73) Assignee: Samsung Electronics, Co., Ltd., Suwon-si, Gyeonggi-do (KR)

( * ) Notice: Subject to any disclaimer, the term of this patent is extended or adjusted under 35 U.S.C. 154(b) by 145 days.

(21) Appl. No.: 11/246,454

(22) Filed: Oct. 7, 2005

(65) Prior Publication Data

US 2006/0270156 A1 Nov. 30, 2006

(30) Foreign Application Priority Data

Oct. 8, 2004 (KR) .................. 10-2004-0080459

(51) Int. Cl.
*H01L 29/788* (2006.01)
(52) U.S. Cl. .................. 257/316; 257/321; 257/324; 257/627; 257/E21.684; 257/E29.129; 257/E29.302
(58) Field of Classification Search .............. 257/316, 257/321, 324, 627, E21.684, E29.129, E29.302
See application file for complete search history.

(56) References Cited

U.S. PATENT DOCUMENTS

| 5,753,525 | A | 5/1998 | Hsu et al. |
| 6,768,158 | B2 | 7/2004 | Lee et al. |
| 7,285,820 | B2 * | 10/2007 | Park et al. ............ 257/316 |
| 2002/0011612 | A1 * | 1/2002 | Hieda ............... 257/262 |
| 2003/0042531 | A1 | 3/2003 | Lee et al. |
| 2004/0004863 | A1 | 1/2004 | Wang |
| 2004/0251487 | A1 * | 12/2004 | Wu et al. ............ 257/315 |
| 2005/0098822 | A1 * | 5/2005 | Mathew et al. ........ 257/314 |

(Continued)

FOREIGN PATENT DOCUMENTS

KR 19950003241 4/1995

(Continued)

OTHER PUBLICATIONS

English Abstract.

*Primary Examiner*—Michelle Estrada
*Assistant Examiner*—Jarrett J Stark
(74) *Attorney, Agent, or Firm*—F. Chau & Associates, LLC

(57) ABSTRACT

A non-volatile memory device includes an upwardly protruding fin disposed on a substrate and a control gate electrode crossing the fin. A floating gate is interposed between the control gate electrode and the fin and includes a first storage gate and a second storage gate. The first storage gate is disposed on a sidewall of the fin, and the second storage gate is disposed on a top surface of the fin and is connected to the first storage gate. A first insulation layer is interposed between the first storage gate and the sidewall of the fin, and a second insulation layer is interposed between the second storage gate and the top surface of the fin. The second insulation layer is thinner than the first insulation layer. A blocking insulation pattern is interposed between the control gate electrode and the floating gate.

18 Claims, 20 Drawing Sheets

U.S. PATENT DOCUMENTS

2005/0121716 A1\* 6/2005 Hill et al. .................... 257/324
2005/0205924 A1\* 9/2005 Yoon et al. .................. 257/317
2005/0227435 A1\* 10/2005 Oh et al. ..................... 438/257
2006/0044915 A1\* 3/2006 Park et al. ................... 365/222

FOREIGN PATENT DOCUMENTS

| KR | 19980016928 | | 6/1998 |
|---|---|---|---|
| KR | 20030020644 | | 3/2003 |
| KR | 2005101668 A | \* | 10/2005 |

\* cited by examiner

US 7,462,904 B2

NON-VOLATILE MEMORY DEVICES AND METHODS OF FORMING THE SAME

CROSS-REFERENCE TO RELATED APPLICATION

This application claims priority under 35 U.S.C. §119 to Korean Patent Application No. 2004-80459, filed on Oct. 8, 2004 in the Korean Intellectual Property Office, the disclosure of which is incorporated herein in its entirety by reference.

BACKGROUND OF THE INVENTION

1. Field of the Invention

The present invention relates to semiconductor devices and methods of forming the same. More specifically, the present invention is directed to non-volatile memory devices and methods of forming the same.

2. Description of Related Art

Non-volatile memory devices retain their stored data even when their power supplies are interrupted. Representative non-volatile memory devices are flash memory devices. Conventionally, flash memory devices have a stacked gate structure that is advantageous in high integration density. A flash memory cell of a typical stacked gate structure is disclosed in Korean Patent Application No. 10-0396698, which will now be described with reference to FIG. 1.

As illustrated in FIG. 1, a control gate electrode 5 is disposed on a semiconductor substrate 1. A floating gate 3 is interposed between the control gate electrode 5 and the semiconductor substrate 1. A tunnel oxide layer 2 is interposed between the floating gate 3 and the semiconductor substrate 1. A dielectric layer 4 is interposed between the control gate electrode 5 and the floating gate 3. The floating gate 3 is electrically isolated by the tunnel oxide layer 2 and the dielectric layer 4.

The conventional flash memory cell stores data of logic "1" or "0" based on the amount of charges stored in the floating gate 3.

Various issues arise as conventional flash memory cells are further developed for higher integration. For example, the width of a channel region below the floating gate 3 tends to decrease, so that the turn-on current of the flash memory cell may decrease sharply to increase the sensing margin of the flash memory device. Further, as the overlap area of the floating gate 3 and the control gate 5 decreases, the coupling ratio of the flash memory cell may decrease to increase the operation voltage of the flash memory cell. Due to the increase in the operation voltage, the power consumption of a device increases and a boundary portion of the substrate 1 may damage, causing the reliability of the flash memory cell to degrade.

SUMMARY OF THE INVENTION

A feature of the present invention is to provide a non-volatile memory device capable of increasing the turn-on current within a limited area and a method of forming the same.

Another feature of the present invention is to provide a non-volatile memory device capable of increasing the coupling ratio within a limited area and a method of forming the same.

Another feature of the present invention is to provide a non-volatile memory device capable of decreasing the operation voltage within a limited area and a method of forming the same.

Another feature of the present invention is to provide a non-volatile memory device capable of optimizing the threshold voltage of a cell and a method of forming the same.

A non-volatile memory device is provided which includes an upwardly protruding fin disposed on a semiconductor substrate and a control gate crossing the fin. A floating gate is interposed between the control gate electrode and the fin. The floating gate includes a first storage gate and a second storage gate. The first storage gate is disposed on a sidewall of the fin, and the second storage gate is disposed on a top surface of the fin and is connected to the first storage gate. A first insulation layer is interposed between the first storage gate and the sidewall of the fin, and a second insulation layer is interposed between the second storage gate and the top surface of the fin. The second insulation layer is thinner than the first insulation layer. A blocking insulation pattern is interposed between the control gate electrode and the floating gate.

In some embodiments, the first storage gate is made of first doped polysilicon and the second storage gate is made of second doped polysilicon. An impurity concentration of the first doped polysilicon may be different from that of the second doped polysilicon. Preferably, the impurity concentration of the first doped polysilicon is higher than that of the second doped polysilicon. At a write or erase operation, the second insulation layer has a thickness sufficient to allow tunneling of charges and the first insulation layer has a thickness sufficient to suppress tunneling of charges. An upper corner of the fin may be rounded. The first and second insulation layer may be made of thermal oxide. An outer sidewall of the first storage gate may be aligned to a sidewall of the second storage gate. The non-volatile memory device may further include a filling insulation pattern disposed over the substrate to surround a lower sidewall of the fin. Alternatively, the non-volatile memory device may further include a buried insulation layer disposed over the substrate. In this case, the fin is disposed on the buried insulation layer.

According to a method of forming a non-volatile device, an upwardly protruding fin is formed on a substrate. A first insulation layer and a first storage pattern are sequentially stacked on a sidewall of the fin. A second insulation layer and a second storage pattern are sequentially formed on a top surface of the fin. The second insulation layer is thinner than the first insulation layer, and the second storage pattern is connected to the first storage pattern. A blocking insulation layer and a control gate conductive layer are sequentially formed on the substrate. The control gate conductive layer, the blocking insulation layer, the first storage pattern, and the second storage pattern are successively patterned to form a floating gate including the first and second storage gates, a block insulation pattern, and a control gate electrode.

In some embodiments, the first storage gate is made of first doped polysilicon and the second storage gate is made of second doped polysilicon. An impurity concentration of the first doped polysilicon is different from that of the second doped polysilicon. Preferably, the impurity concentration of the first doped polysilicon is higher than that of the second doped polysilicon. Forming the first insulation layer, the first storage pattern, the second insulation layer, and the second storage pattern may include forming a first insulation layer on a top surface and a sidewall of the fin. A first storage layer is formed on the first insulation layer to surround the sidewall of the fin. In this case, the first insulation layer formed on the top surface of the fin is exposed. The exposed first insulation layer is selectively removed to expose the top surface of the fin. A second insulation layer is selectively formed on the exposed top surface of the fin. A second storage layer is formed to cover the second insulation layer and to be connected to the first storage layer. The second storage layer and the first storage layer are successively patterned to form the second and first storage patterns.

In some embodiments, exposing the top surface of the fin to form the second insulation may include forming an oxidation barrier layer on an entire surface of a substrate having the exposed first insulation layer. The oxidation barrier layer is patterned to expose a predetermined area of the exposed first insulation layer. Using the patterned oxidation barrier layer as a mask, the first insulation layer is etched to expose the top surface of the fin. The substrate is thermally oxidized to form the second insulation layer. The patterned oxidation barrier layer is then removed.

In some embodiments, exposing the top surface of the fin to form the second insulation layer may include recessing the first storage layer to be shorter than the exposed top surface of the first insulation layer. An oxidation barrier layer is formed on a substrate to fill the recessed area. The oxidation barrier layer is planarized until the first insulation layer is exposed. Using the planarized oxidation barrier layer as an etch mask, the exposed first insulation layer is etched to expose the top surface of the fin. The substrate is thermally oxidized to form the second insulation layer. The planarized oxidation barrier layer is then removed.

In some embodiments, at a write or erase operation, the second insulation layer has a thickness sufficient to allow tunneling of charges and the first insulation layer has a thickness sufficient to suppress tunneling of charges.

In some embodiments, an upper corner of the fin may be rounded. In this case, forming the fin may include forming a mask pattern on a predetermined area of the substrate. A substrate having the mask pattern is thermally oxidized to form a sacrificial thermal oxide layer including a bird's beak below the edge of a lower portion of the mask pattern. Using the mask pattern as an etch mask, the sacrificial oxide layer and the substrate are successively anisotropically etched to form the fin and to remove the mask pattern and the bird's beak.

In some embodiments, the method further includes forming a filling insulation pattern on the substrate to surround a lower sidewall of the fin.

In some embodiments, the substrate may be a SOI substrate including a handling substrate, a buried insulation layer, and a device layer, which are stacked in the order named. The method may include patterning the device layer to form the fin on the buried insulation layer.

BRIEF DESCRIPTION OF THE DRAWINGS

FIG. 3A through FIG. 9A are top plan views for explaining a method of forming a non-volatile memory device according to an embodiment of the present invention.

FIG. 3B through FIG. 9B are cross-sectional views taken along lines III-III' of FIG. 3A through FIG. 9A, respectively.

FIG. 3C through FIG. 9C are cross-sectional views taken along lines IV-IV' of FIG. 3A through FIG. 9A, respectively.

FIG. 10A through FIG. 12A are top plan views for explaining a method of selectively forming an insulation layer on a top surface of a fin, in the method of forming the non-volatile memory device according to an embodiment of the present invention.

FIG. 10B through FIG. 12B are cross-sectional views taken along lines V-V' of FIG. 10A through FIG. 12A, respectively.

FIG. 10C through FIG. 12C are cross-sectional views taken along lines VI-VI' of FIG. 10A through FIG. 12A, respectively.

DETAILED DESCRIPTION OF PREFERRED EMBODIMENTS

Figure 1:
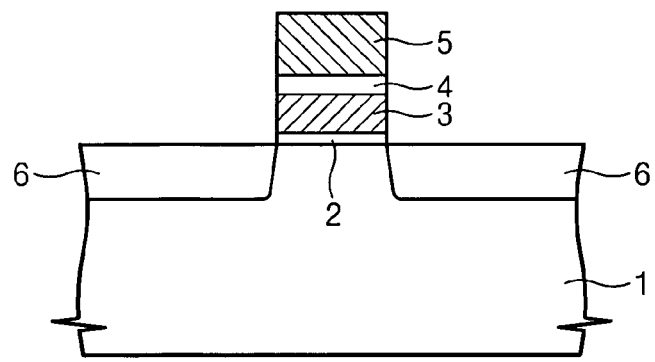
FIG. 1 illustrates a flash memory cell of a conventional stacked gate structure.

The present invention will now be described more fully hereinafter with reference to the accompanying drawings, in which preferred embodiments of the invention are shown. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 2A:
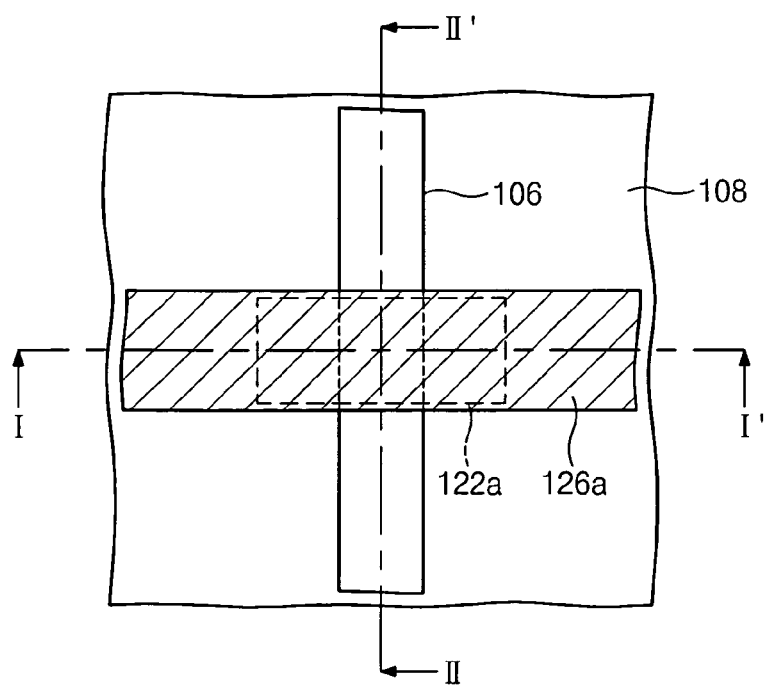
FIG. 2A is a top plan view of a non-volatile memory device according to an embodiment of the present invention.
Figure 2B:
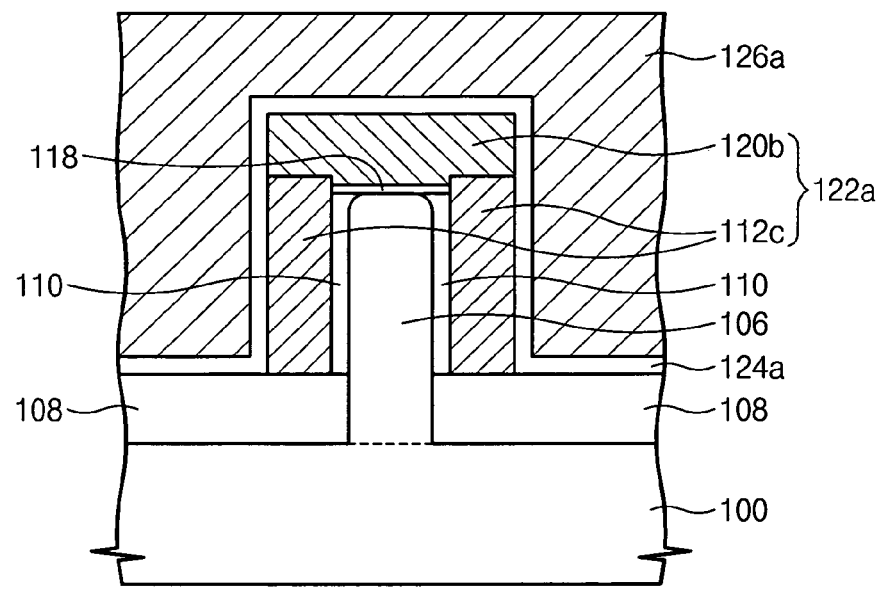
FIG. 2B and FIG. 2C are cross-sectional views taken along lines I-I' and II-II' of FIG. 2A, respectively.
Figure 2C:
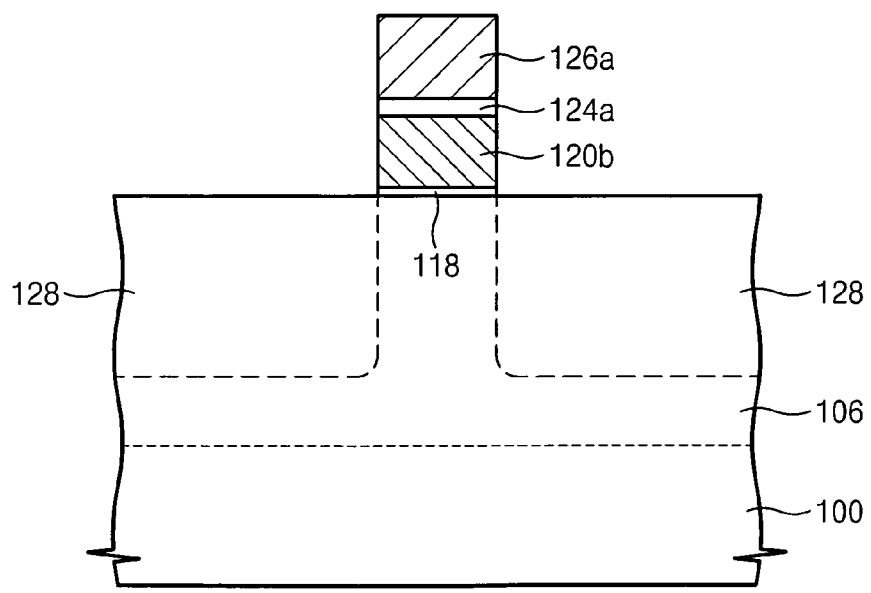

FIG. 2A is a top plan view of a non-volatile memory device according to an embodiment of the present invention. FIG. 2B and FIG. 2C are cross-sectional views taken along lines I-I' and II-II' of FIG. 2A, respectively.

As illustrated in FIG. 2A, FIG. 2B, and FIG. 2C, a non-volatile memory device includes a fin 106 disposed on a semiconductor substrate (hereinafter briefly referred to as "substrate") 100. The fin 106 protrudes upwardly. The substrate 100 may be a bulk substrate. Preferably, an upper corner of the fin 106 is rounded so as to prevent concentration of an electric field. The fin 106 may be made of the same material as the substrate 100. A filling insulation pattern 108 is disposed on the substrate 100 to surround a lower sidewall of the fin 106. The filling insulation pattern 108 may be made of silicon oxide, particularly, high-density plasma silicon oxide or SOG of a superior gap-fill property. The filling insulation pattern 108 may act as a device isolation layer to isolate adjacent devices.

A control gate electrode 126a is disposed over the substrate 100 to cross the fin 106. The control gate electrode 126a is disposed on the filling insulation pattern 108. A floating gate 122a is interposed between the control gate electrode 126a and the fin 106. The floating gate 122a includes first storage gate 112c and a second storage gate 120b. The first storage gate 112c is disposed on a sidewall of the fin 106 below the control gate electrode 126a, and the second storage gate 112c is disposed on the top surface of the fin 106 below the control gate electrode 126a. The second storage gate 120b is electrically connected to the first storage gate 112c. Particularly, the second storage gate 120b extends laterally to be connected to the top surface of the first storage gate 112c.

Specifically, a pair of the first storage gates 112c are disposed on both sidewalls of the fin 106 below the control gate electrode 126a, respectively. The second storage gate 120b is disposed on the top surface of the fin 106 and extends in both side directions to be connected to top surfaces of the pair of the first storage gates 112c. The floating gate 122a includes the pair of the first storage gates 112c and the second storage gate 120b.

An outer sidewall of the first storage gate 112c is aligned to a sidewall of the second storage gate 120b. As illustrated in FIG. 2B, a contact face (i.e., the top surface of the first storage gate) 112c of the first and second storage gates 112c and 120b may be taller than the top surface of the fin 106. Alternatively, the contact face of the first and second storage gates 112c and 120b may be as tall as the top surface of the fin 106.

A first insulation layer 110 is interposed between the first storage gate 112c and the sidewall of the fin 106, and a second insulation layer 118 is interposed between the second storage gate 120b and the top surface of the fin 106. A blocking insulation pattern 124a is interposed between the floating gate 122a and the control gate electrode 126a. An impurity doping layer 128 is disposed on the fin 106 of opposite sides adjacent to the control gate electrode 126a to act as a source/drain region.

The second insulation layer 118 is thinner than the first insulation layer 110. Preferably, at a write or erase operation, the second insulation layer 118 is thin enough to allow tunneling of charges and the first insulation layer 110 is thick enough to suppress tunneling of charges. Thus, at a write or erase operation, charges may be tunneled only through the second insulation layer 118 disposed on the top surface of the fin 106. That is, only the second insulation layer 118 functions as a tunnel insulation layer.

A channel region is defined at the fin 106 below the floating gate 122a. Since the channel region includes a vertical channel region defined at both sidewalls of the fin 106 and a horizontal channel region defined at the top surface of the fin 106, a width of the channel region increases within a limited area. This leads to an increase in the turn-on current, so that the sensing margin of the non-volatile memory device increases. As a result, the operation voltage drops, which leads to a non-volatile memory device of lower power consumption.

Due to the thick first insulation layer 110 disposed on both sides of the fin 106, the capacitance between the first storage gate 112c and the fin 106 decreases. That is, the capacitance between the floating gate 122a and the fin 106 decreases. The floating gate 122a has a 3-dimensional structure to cover the top surface and both sidewalls of the fin 106, and the control gate electrode 126a cover the top surface and an outer sidewall of the floating gate 122a. Therefore, an overlap area of the floating gate 122a and the control gate electrode 126a increase. Since this leads to increase in the capacitance between the floating gate 122a and the control gate electrode 126a, the capacitance between the floating gate 122a and the control gate electrode 126a increases. The capacitance between the floating gate 122a and the fin 106 decreases while the capacitance between the floating gate 122a and the control gate electrode 126a increases, leading to an increase in the coupling ratio of a non-volatile memory cell. Thus, the operation voltage of the non-volatile memory cell decreases, leading to a non-volatile memory device of lower power consumption.

The control gate electrode 126a is made of a conduction material. That is, the control gate electrode 126a may be made of one selected from the group consisting of, for example, doped polysilicon and metal silicide (e.g., tungsten silicide, cobalt silicide, nickel silicide and titanium silicide), conductive metal nitride (e.g., titanium nitride and tantalum nitride), metal (e.g., tungsten and molybdenum), and combinations thereof. The blocking insulation pattern 124a may be made of oxide-nitride-oxide (ONO). Alternatively, the blocking insulation pattern 124a may include a high-k dielectric layer having a higher dielectric constant than the blocking insulation pattern 124a. The blocking insulation pattern 124a may include, for example, a metal oxide layer (e.g., aluminum oxide layer or hafnium oxide layer) that is a high-k dielectric layer. Preferably, the first and second insulation layers 110 and 118 are made of silicon oxide having a superior characteristic, for example, thermal oxide.

Preferably, the floating gate 122a is made of first doped polysilicon and the second floating gate 112 is made of second doped polysilicon. Thus, the first and second storage gates 112c and 120b may be made of different doped polysilicons to optimize the characteristics of the non-volatile memory cell, particularly, the threshold voltage.

Since the first and second storage gates 112c and 120b are electrically interconnected, the first and second doped polysilicons are doped with the same impurities. An impurity concentration of the first doped polysilicon may be different from that of the second doped polysilicon. Preferably, the impurity concentration of the first doped polysilicon is higher than that of the second doped polysilicon. Therefore, a non-volatile memory device having a uniform threshold voltage throughout the channel region (e.g., the vertical and horizontal channel regions) is made.

Since the thickness of the first insulation layer 110 is different from that of the second insulation layer 118, threshold voltages of the vertical channel region and the horizontal channel region may be different from each other. Since the first insulation layer 110 is thicker than the second insulation layer 118, an absolute value of the vertical channel region may be greater than that of the horizontal channel region. In this regard, an impurity concentration of the first storage gate 112c increases relatively to enable a threshold voltage of the horizontal channel region to rise. Therefore, a uniform threshold voltage is achieved at the entire area of the channel region. As a result, when the non-volatile memory cell is sensed, the entire area of the channel region is simultaneously turned on to enhance the operating speed of the non-volatile memory device.

Preferably, the impurities of the first and second doped polysilicons have the same type as the impurities of the impurity doping layer 128. Further, the type of the impurities of the first and second doped polysilicons may be different from that of the impurities of the channel region.

A method of forming a non-volatile memory device according to the present invention will now be described more fully hereinafter.

FIG. 3A through FIG. 9A are top plan views for explaining a method of forming a non-volatile memory device according to an embodiment of the present invention. FIG. 3B through FIG. 9B are cross-sectional views taken along lines III-III' of FIG. 3A through FIG. 9A, respectively. FIG. 3B through FIG. 9B are cross-sectional views taken along lines IV-IV' of FIG. 3A through FIG. 9A, respectively.

Figure 3A:
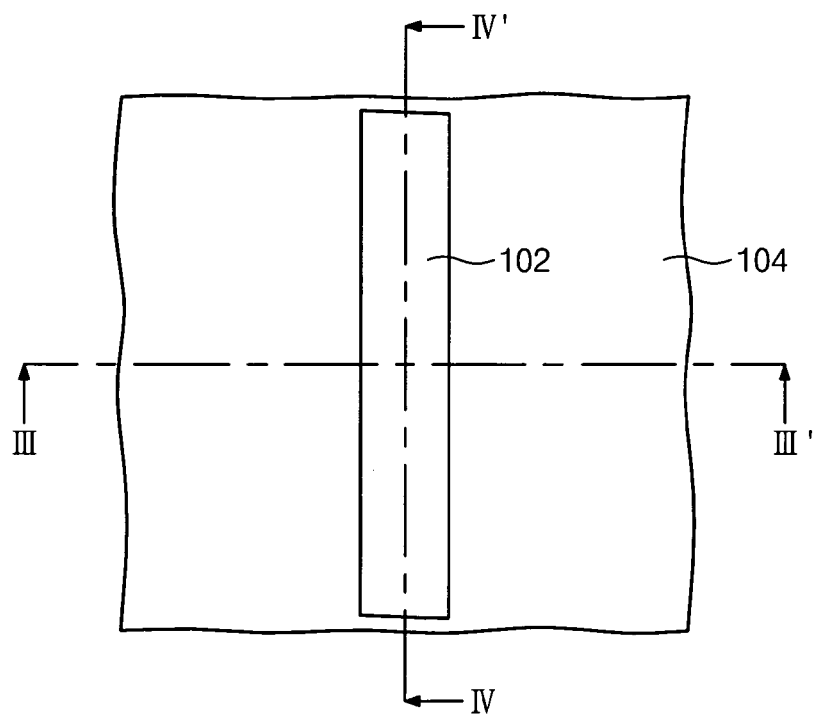
Figure 3B:
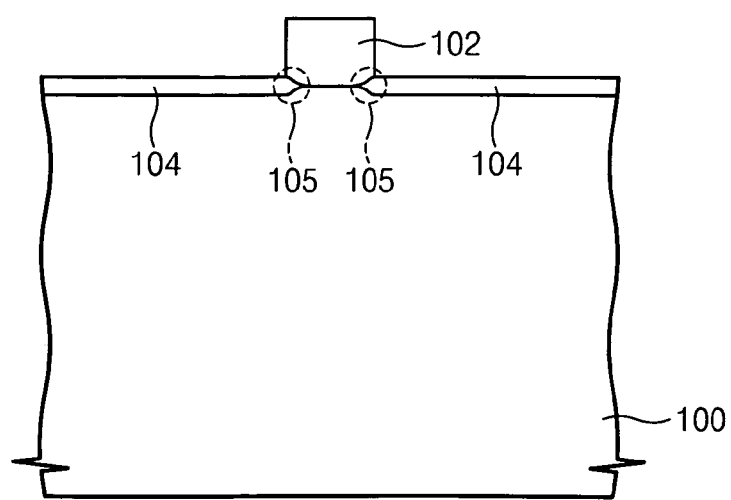
Figure 3C:
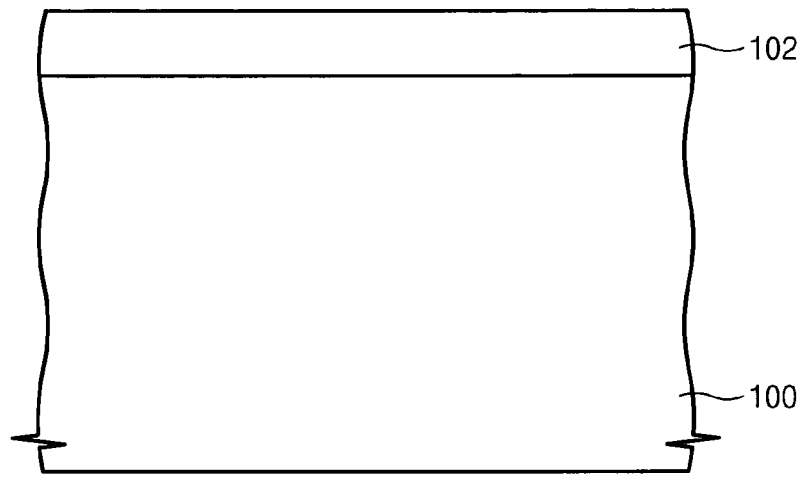

Referring to FIG. 3A, FIG. 3B, and FIG. 3C, a mask pattern 102 is formed on a predetermined region of a substrate 100. The substrate 100 may be a bulk substrate. The mask pattern 102 serves to prevent oxidation caused by a thermal oxidation process and is made of a material having an etch selectivity with respect to a thermal oxide layer and the substrate 100. The mask pattern 102 may be, for example, a single layer of silicon nitride or a multiple layer of silicon oxide/silicon nitride.

A substrate 100 including the mask pattern 102 is thermally oxidized to form a sacrificial thermal oxide layer 104. A bird's beak 105, which is an extending portion of the sacrificial thermal oxide layer 104, is formed below the edge of a power portion of the mask pattern 102.

Figure 4A:
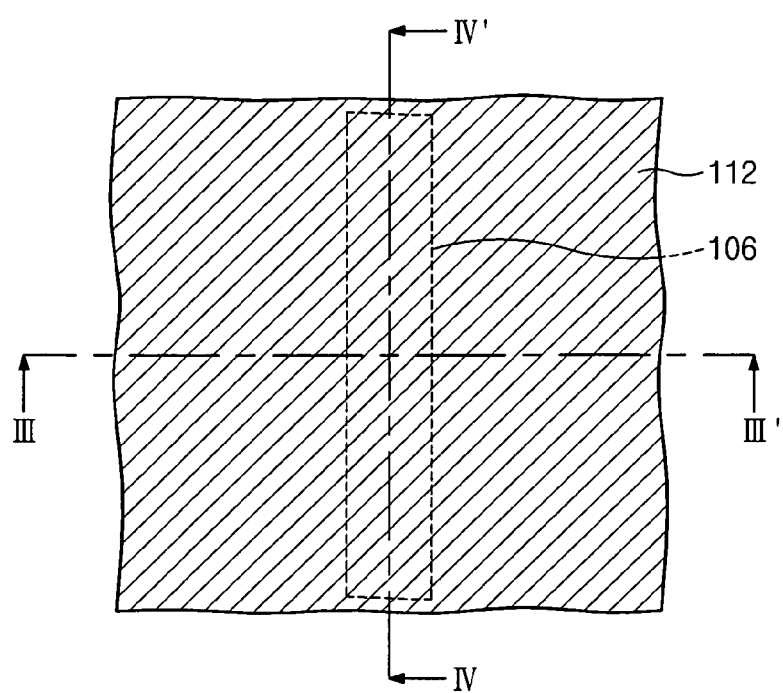
Figure 4B:
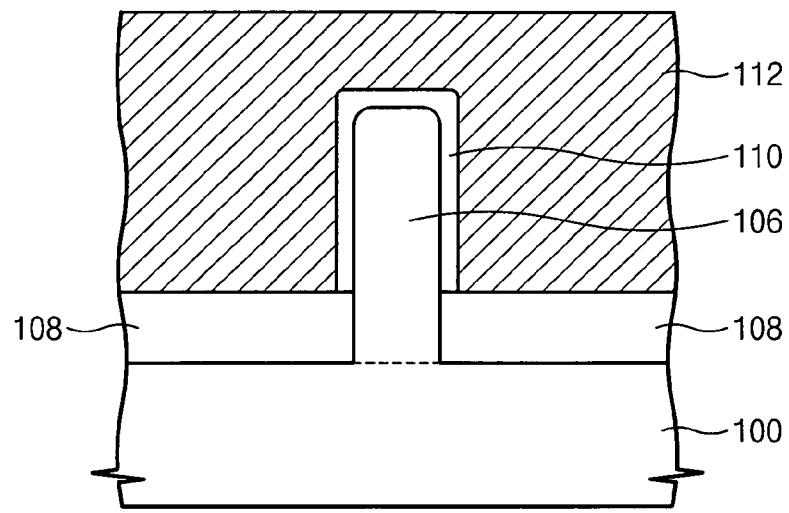
Figure 4C:
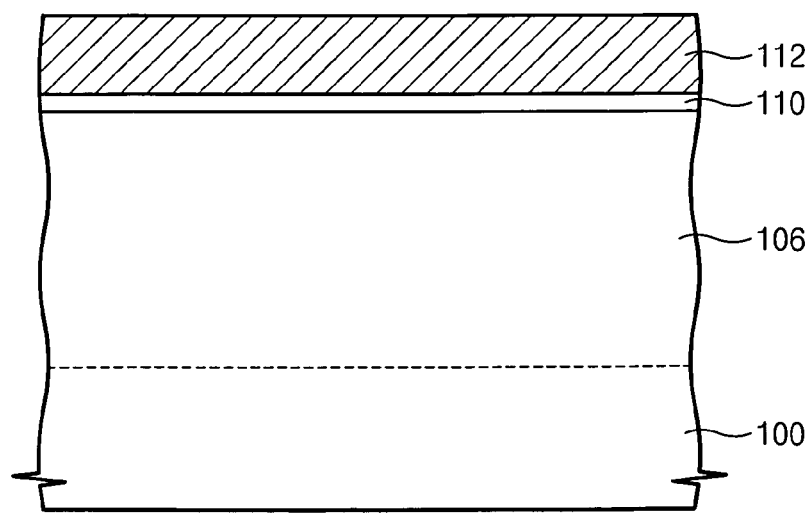

Referring to FIG. 4A, FIG. 4B, and FIG. 4C, using the mask pattern 102 as an etch mask, the thermal oxide layer 104 and the substrate 100 are successively anisotropically etched to form a fin 106 protruding upwardly on the substrate 100. Due to the bird's beak 105, an upper corner of the fin 106 is rounded. The bird's beak 105 may remain even after the etch process for forming the fin 106 is finished. To cure the etch damage of the fin 106, a thermal oxidation process may be carried out to form a sidewall thermal oxide layer (not shown).

A filling insulation layer is formed on the entire surface of the substrate 100. The filling insulation layer is planarized until the mask pattern 102 is exposed. The planarized filling insulation layer is recessed to form a filling insulation pattern 108 surrounding a lower sidewall of the fin 102. The mask pattern 102 and the remaining bird's beak 105 are removed to expose both sidewalls and the top surface of an upper portion of the fin 106. The bird's beak 105 may be removed when the planarized filling insulation layer is recessed. Alternatively, the bird's beak 105 may be removed by a process of removing the mask pattern 102 or an additional removal process. In some exemplary embodiments, the filling insulation pattern 108 may be formed following removal of the mask pattern 102. The filling insulation pattern 108 may be made of an insulation material having a superior gap-fill property, for example, high-density plasma oxide or SOG.

A first insulation layer 110 is formed on the exposed surface of the fin 106 (i.e., a top surface and an upper sidewall of the fin 106). Preferably, the first insulation layer 110 is made of thermal oxide. A first storage layer 112 is formed on the entire surface of the substrate 100 to fill the etched portion of the substrate 100. A top surface of the first storage layer 112 may be planarized. Preferably, the first storage layer 112 is made of first doped polysilicon.

Figure 5A:
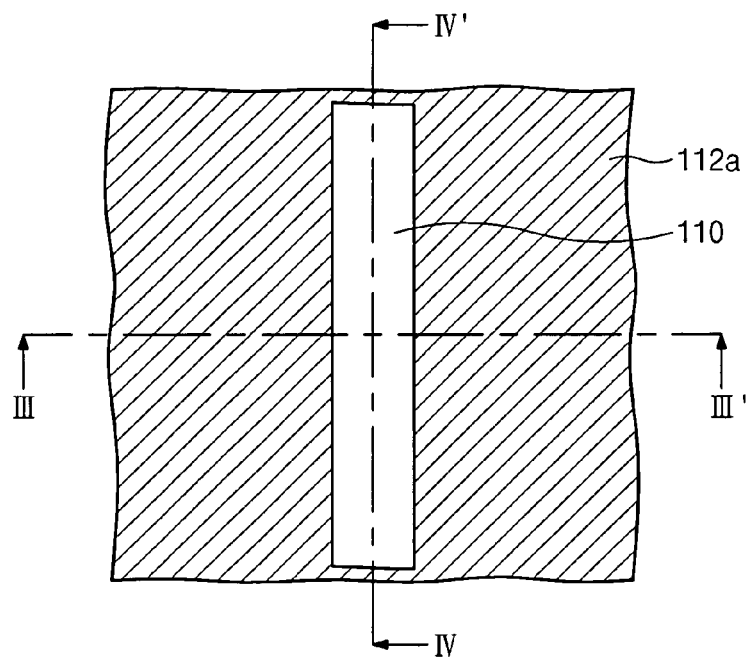
Figure 5B:
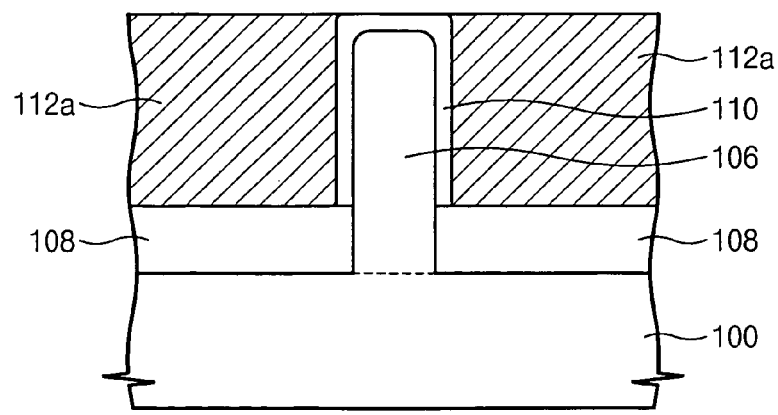
Figure 5C:
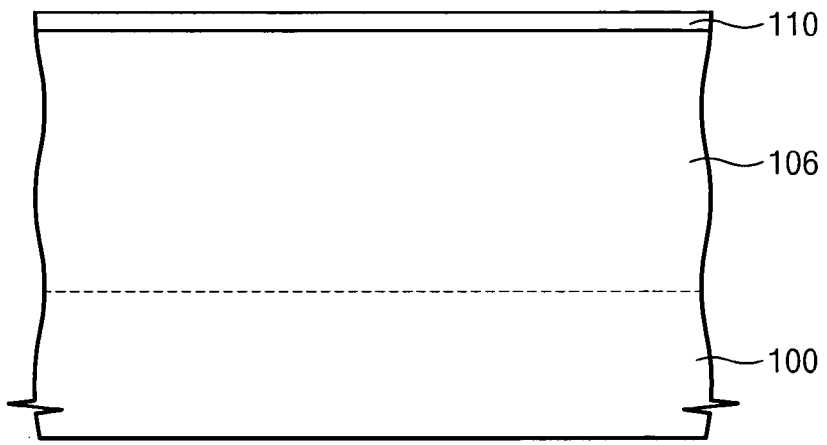

Referring to FIG. 5A, FIG. 5B, and FIG. 5C, the first storage layer 112 is planarized until the first insulation layer 110 disposed on the top surface of the fin 106 is exposed. The planarization process may be done using chemical mechanical polishing (CMP) or etch-back. The planarized first storage layer 112a surrounds the sidewall of the fin 106 with the first insulation layer interposed therebetween. More specifically, the planarized first storage layer 112a surrounds the upper sidewall of the fin 106 protruding upwardly on the filling insulation pattern 108.

Figure 6A:
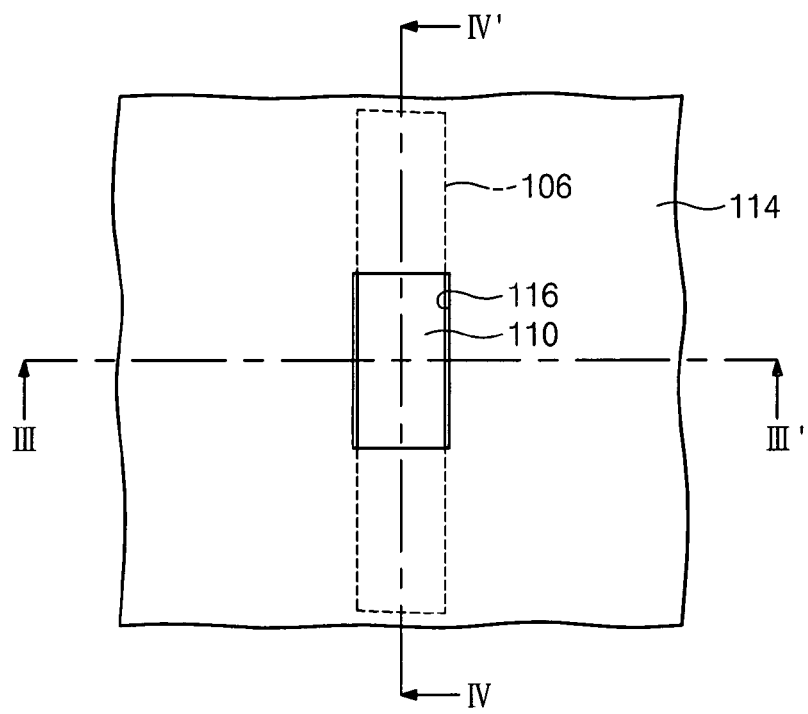
Figure 6B:
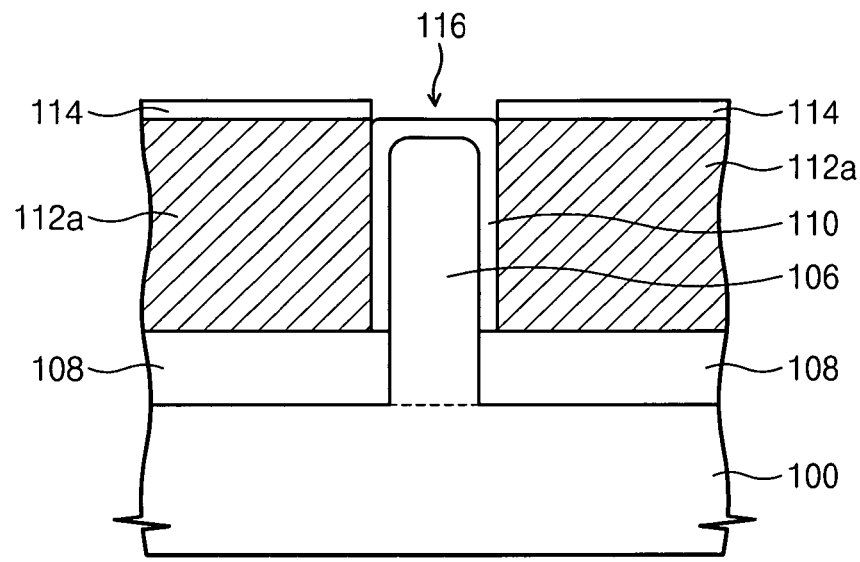
Figure 6C:
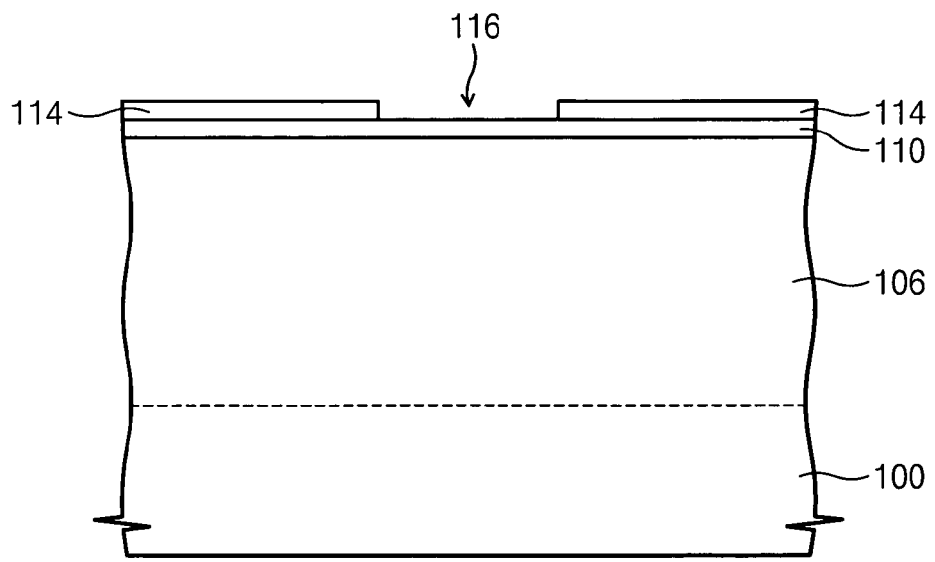

Referring to FIG. 6A, FIG. 6B, and FIG. 6C, an oxidation barrier layer 114 is formed on the entire surface of the substrate 100. The oxidation barrier layer 114 is made of a material to prevent oxidation of the planarized first storage layer 112a. Preferably, the oxidation barrier layer 114 is made of a material (e.g., silicon nitride or silicon oxynitride) having an etch selectivity with respect to the first insulation layer 110.

The oxidation barrier layer 114 is patterned to form an opening 116 exposing a predetermined area of the first insulation layer 110. The exposed first insulation layer 110 is disposed on the top surface of the fin 106. The area exposed by the opening 116 includes a horizontal channel region of a channel region and may be larger than the horizontal channel region to secure an align margin. Although FIG. 6B shows that a sidewall of the opening 116 is aligned to the planarized first storage layer 112a, the opening 116 may expose a portion adjacent to the first insulation layer 110 of the planarized first storage layer 112a.

Figure 7A:
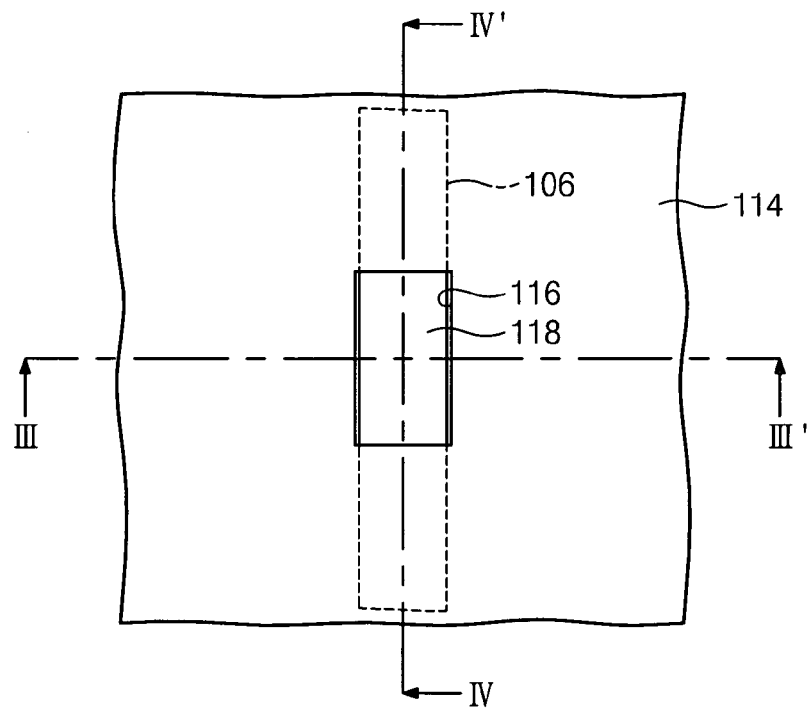
Figure 7B:
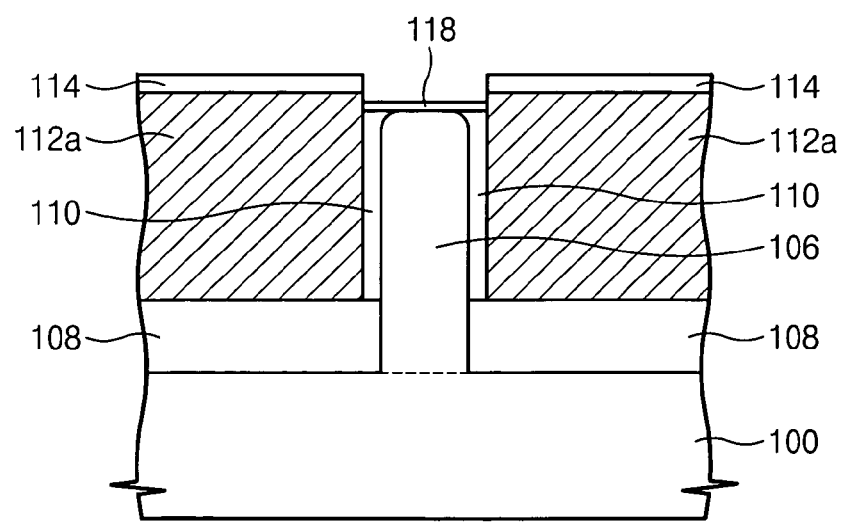
Figure 7C:
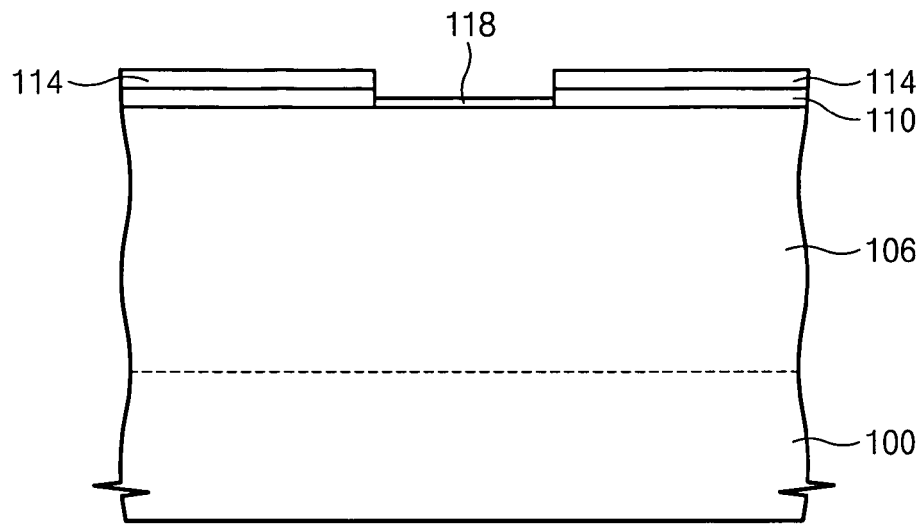

Referring to FIG. 7A, FIG. 7B, and FIG. 7C, using the patterned oxidation barrier layer 114 as an etch mask, the exposed first insulation layer 110 is removed to expose the top surface of the fin 106.

The substrate 100 is then thermally oxidized to form a second insulation layer 118 on the exposed top surface of the fin 106. The second insulation layer 118 is thinner than the first insulation layer 110. At a write or erase operation, the second insulation layer 118 is preferably thin enough to allow tunneling of charges. In contrast, at a write or erase operation, the first insulation layer 110 is preferably thick enough to suppress tunneling of charges. Accordingly, the second insulation layer 118 corresponds to a tunnel insulation layer.

Figure 8A:
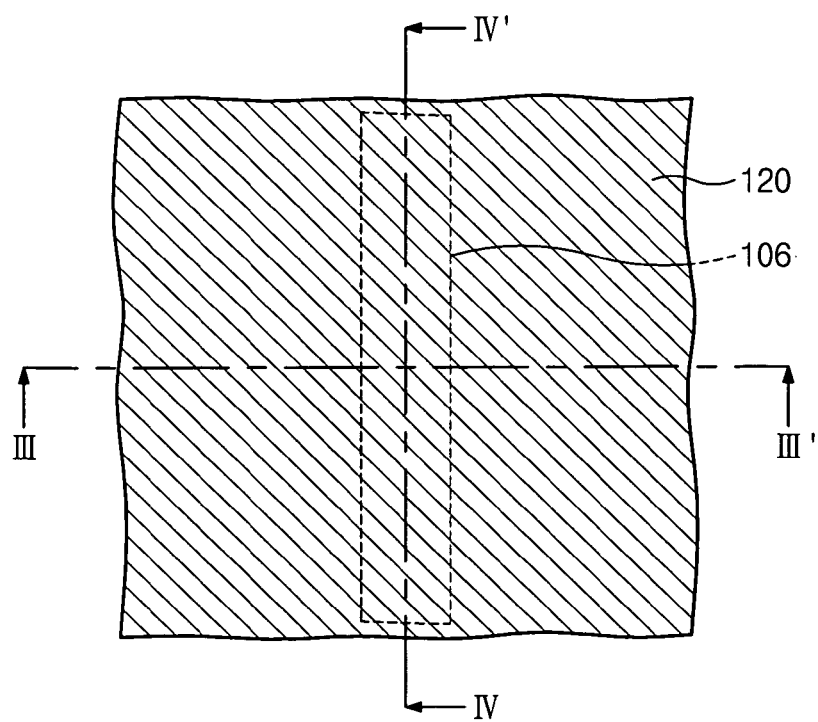
Figure 8B:
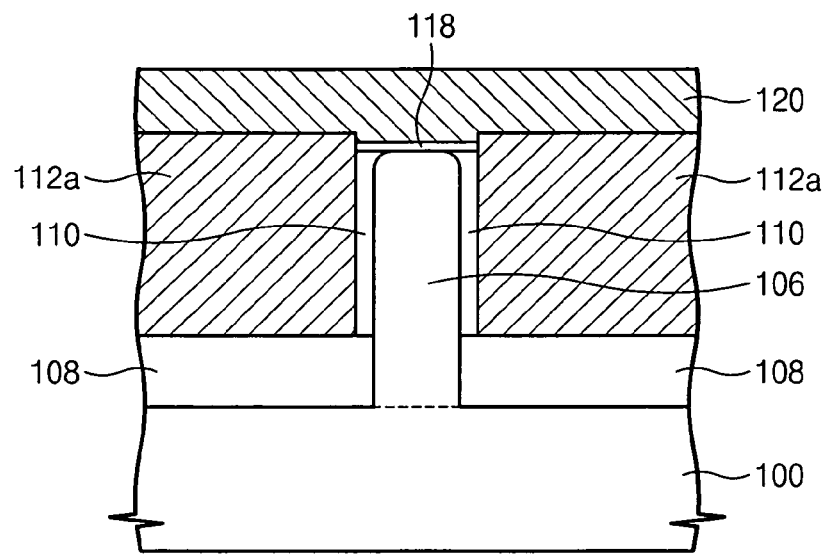
Figure 8C:
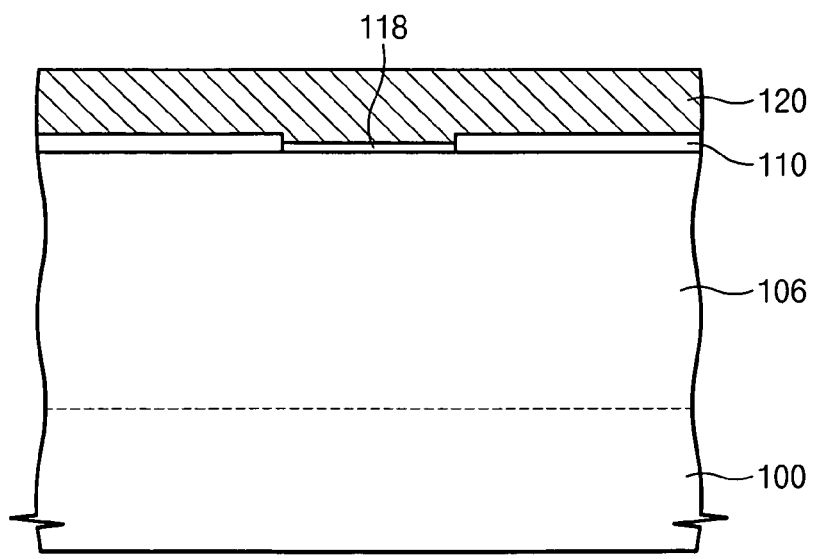

Referring to FIG. 8A, FIG. 8B, and FIG. 8C, the patterned oxidation barrier layer 114 is removed from the substrate 100 to expose the planarized first storage layer 112a. A second storage layer 120 is formed on the entire surface of the substrate 100. The second storage layer 120 covers the second insulation layer 118 and is electrically connected to the planarized first storage layer 112a. Preferably, the second storage layer 120 is made of second doped polysilicon.

Preferably, the first polysilicon of the planarized first storage layer 112a and the second polysilicon of the second storage layer are doped with impurities of the same type to achieve their electric connection. But their impurity concentrations are different from each other. Particularly, the impurity concentration of the first doped polysilicon is preferably higher than that of the second doped polysilicon.

By the foregoing, a contact surface of the second storage layer 120 and the planarized first storage layer 112a (i.e., the top surface of the planarized first storage layer 112a) may be taller than the top surface of the fin 106.

Referring to FIG. 2A, FIG. 2B, FIG. 2C, FIG. 9A, FIG. 9B, and FIG. 9C, the second storage layer 120 and the planarized first storage layer 112a are successively patterned to form a second storage pattern 120a and a first storage pattern 112b. The first storage pattern 112b surrounds the sidewall of the fin 106 with the first insulation layer 110 interposed therebetween. The second storage pattern 120a covers the top surface of the fin 106 with the second insulation layer 118 interposed therebetween and is electrically connected to the first storage pattern 112b. The first and second storage patterns 112b and 120a constitute a preliminary floating gate 122 that is disposed in parallel with the fin 106.

Although not shown in these figures, in the case where the opening 116 exposes a portion of the planarized first storage layer 112a adjacent to the first insulation layer 110, the second insulation layer 118 may be formed on a portion of the first storage layer 112a. In this case, only a portion of the top surface of the first storage pattern 112b is connected to the second storage pattern 120a.

A blocking insulation layer 124 is conformally formed on the entire surface of a substrate 100 including the preliminary floating gate 122. The blocking insulation layer 124 may be oxide-nitride-oxide (ONO). Alternatively, the blocking insulation layer 124 may be a high-k dielectric substance having a higher dielectric constant than silicon nitride. The blocking insulation layer 124 may be made of metal oxide such as, for example, aluminum oxide or hafnium oxide.

A control gate conductive layer 126 is formed on the blocking insulation layer 124. The control gate conductive layer 126 may be made of, for example, one selected from the group consisting of doped polysilicon (e.g., tungsten and molybdenum), conductive metal nitride (e.g., titanium nitride and tantalum nitride), metal silicide (e.g., tungsten silicide, cobalt silicide, nickel silicide and titanium silicide), and combinations thereof.

A capping insulation layer (not shown) may be formed on the control gate conductive layer 126. The capping insulation layer may be made of one selected from the consisting of silicon oxide, silicon nitride, silicon oxynitride, and combinations thereof.

The control gate conductive layer 126, the blocking insulation layer 124, and the preliminary floating gate 122 are successively patterned to form a floating gate 122a, a blocking insulation layer 124, and a control gate electrode 126a, which are illustrated in FIG. 2A, FIG. 2B, and FIG. 2C. The floating gate 122a includes a first storage gate 112a and a second storage gate 120b. The first storage gate 112a covers a sidewall of the fin 106 with the first insulation layer 110 interposed therebetween, and the second storage gate 120b covers a top surface of the fin 106 with the second insulation layer 118 interposed therebetween and is connected to the first storage gate 112c. The first and second storage gates 112c and 120b are formed from the first and second storage patterns 112b and 120a, respectively.

Using the control gate electrode 126a as a mask, impurities are implanted to form an impurity doping layer 128 illustrated in FIG. 2C. The first insulation layer 110 and/or the second insulation layer 118 formed the surface of the fin 106 disposed at opposite sides adjacent to the control gate electrode 126a may be removed before or after formation of the impurity doping layer 128.

The non-volatile memory device may have the effects that are described with reference to FIG. 2A, FIG. 2B, and FIG. 2C. That is, a channel region is defined at opposite sides and a top surface of the fin 106 below a control gate electrode 126a to increase the width of the channel region within a limited area. Thus, the turn-on current of the non-volatile memory cell increases. Further, the first insulation layer 110 is thicker than the second insulation layer 118, so that the capacitance between the first storage gate 112c and the fin 106 decreases. On the other hand, an overlap area of the control gate electrode 126a and the floating gate 122a of the 3-dimensional structure increases, so that their capacitance increases. As a result, the coupling ratio of the non-volatile memory cell increases. Since the first and second storage layers 112 and 120 are made of the first and second doped polysilicons that are sequentially formed, characteristics of the doped first and second polysilicons will be different. Particularly, since the impurity concentration of the doped first polysilicon is higher than that of the second doped polysilicon, a threshold voltage of the non-volatile memory cell may be uniformly achieved at the whole area of the channel region to enhance the operating speed of the non-volatile memory device.

Using another method, the second insulation layer 118 may selectively form on the top surface of the fin 106, which will be described with reference to FIG. 10A through FIG. 12A, FIG. 10B through FIG. 12B, and FIG. 10C through FIG. 12C.

FIG. 10A through FIG. 12A are top plan views for illustrating a method of selecting an insulation layer on the top surface of the fin, in the method of forming the non-volatile memory device according to an embodiment of the present invention. FIG. 10B through FIG. 12B are cross-sectional views taken along lines V-V' of FIG. 10A through FIG. 12A, respectively. FIG. 10C through FIG. 12C are cross-sectional views taken along lines VI-VI' of FIG. 10A through FIG. 12A, respectively.

In this method, exposing a first insulation layer 110 formed on a top surface of a fin 106 is performed by the same manner as previously described with reference to FIG. 3A through FIG. 5A, FIG. 3B through FIG. 5B, and FIG. 3C through FIG. 5C.

Referring to FIG. 5A, FIG. 5B, FIG. 5C, FIG. 10A, FIG. 10B, and FIG. 10C, recessed is a first storage layer 112a that is planarized until a first insulation layer 110 disposed on a top surface of a fin 106 is exposed. The top surface of the recessed first storage layer 112a' is shorter than the top surface of the exposed first insulation layer 110. The top surface of the recessed first storage layer 112a' may be as tall as the top surface of the fin 106.

An oxidation barrier layer is formed on the entire surface of the substrate 100 to fill the recessed portion of the planarized first storage layer 112a. The oxidation barrier layer is planarized until the first insulation layer 110 disposed on the top surface of the fin 106 is exposed. Thus, the planarized oxidation barrier layer 114' is self-aligned to cover the recessed first storage layer 112a'. The first insulation layer 110 formed on the top surface of the fin 106 is fully exposed. The oxidation barrier layer is made of the same material as the oxidation barrier layer 114 illustrated in FIG. 6A, FIG. 6B, and FIG. 6C.

Figure 11A:
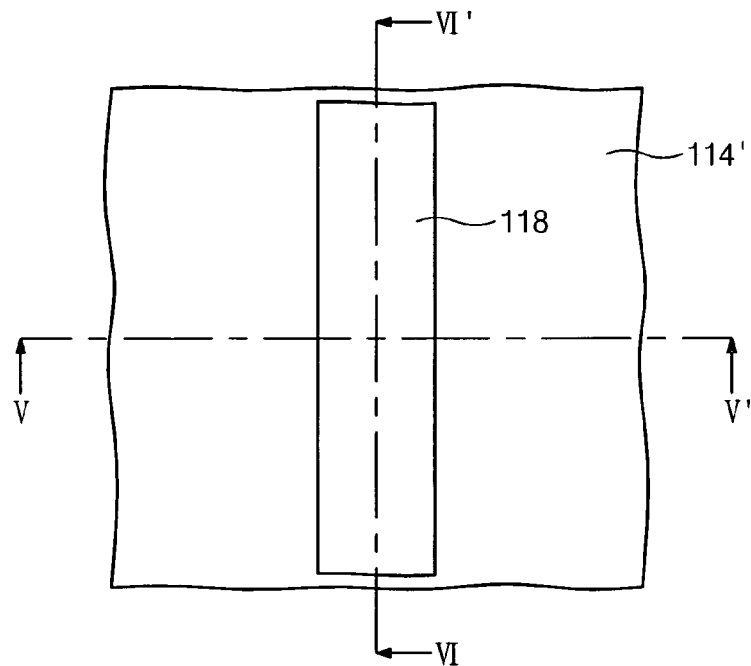
Figure 11B:
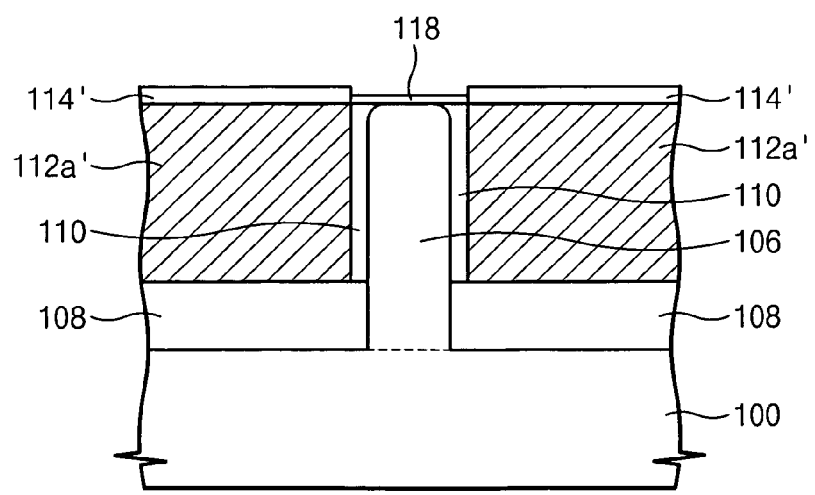
Figure 11C:
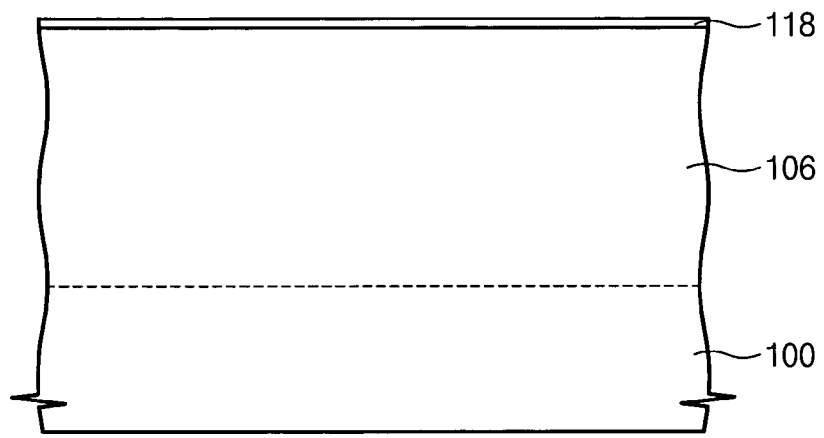

Referring to FIG. 11A, FIG. 11B, and FIG. 11C, using the planarized oxidation barrier layer 114' as the etch mask, the exposed first insulation layer 110 is etched to expose the whole top surface of the fin 106.

A thermal oxidation process is carried out to form a second insulation layer 118 on the exposed top surface of the fin 106. The second insulation layer 118 is formed on the entire top surface of the fin 106.

Figure 12A:
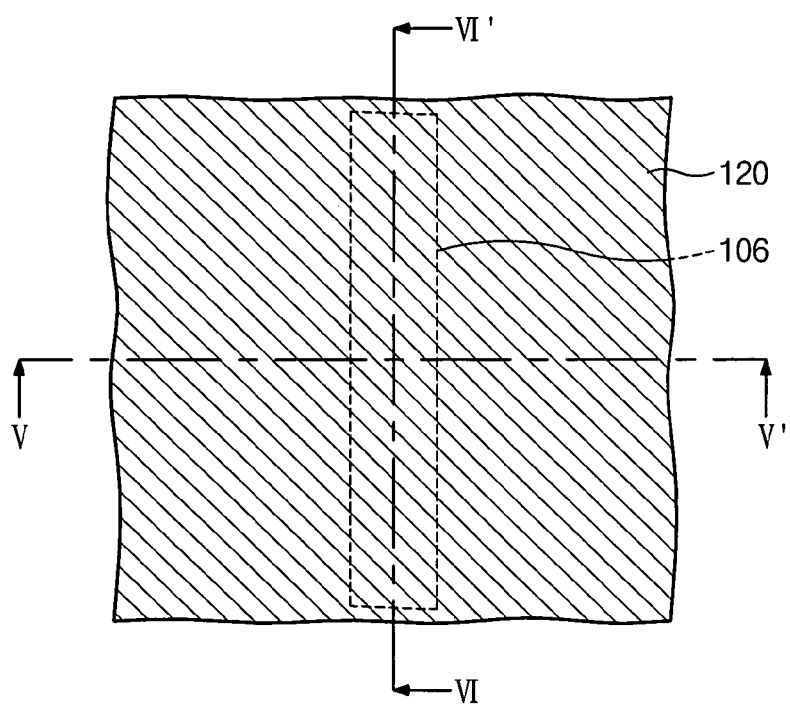
Figure 12B:
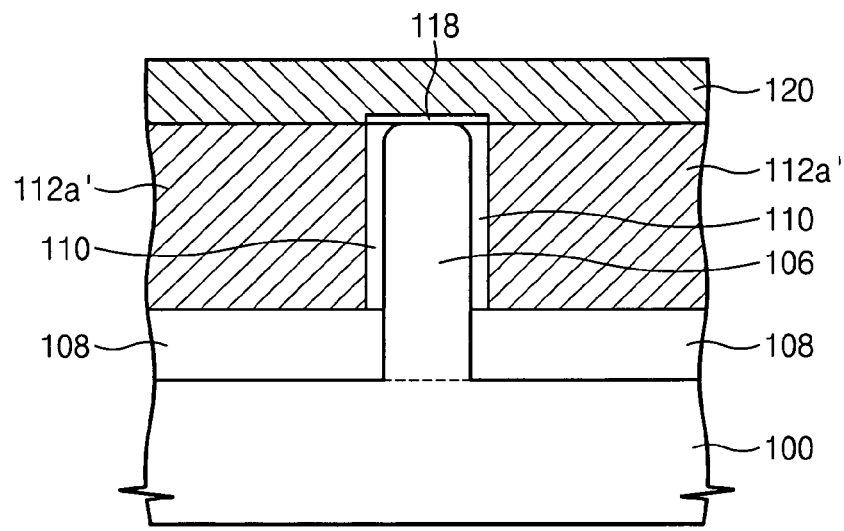
Figure 12C:
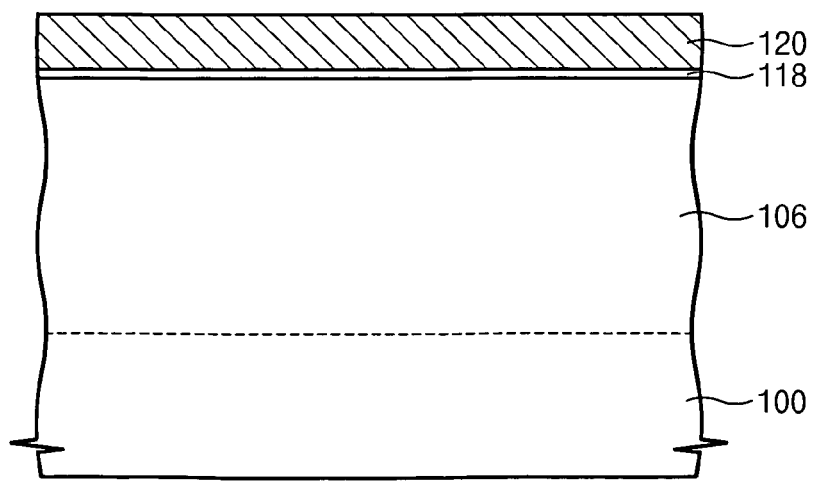

Referring to FIG. 12A, FIG. 12B, and FIG. 12C, the planarized oxidation barrier layer 114' is removed from the substrate 100 to expose the top surface of the recessed first storage layer 112a'. A second storage layer 120 is formed on the entire surface of the substrate 100 to cover the second insulation layer 118 and to electrically connect to the first storage layer 112a'.

Figure 9A:
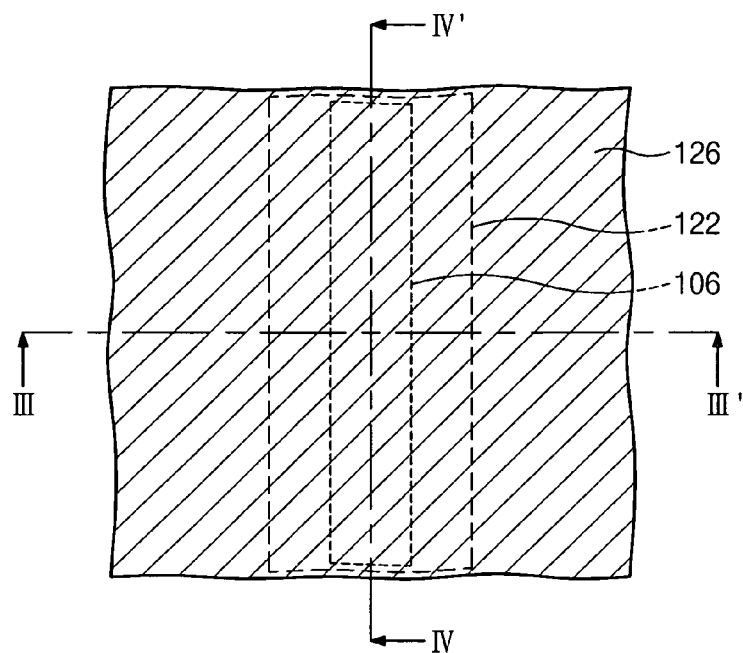
Figure 9B:
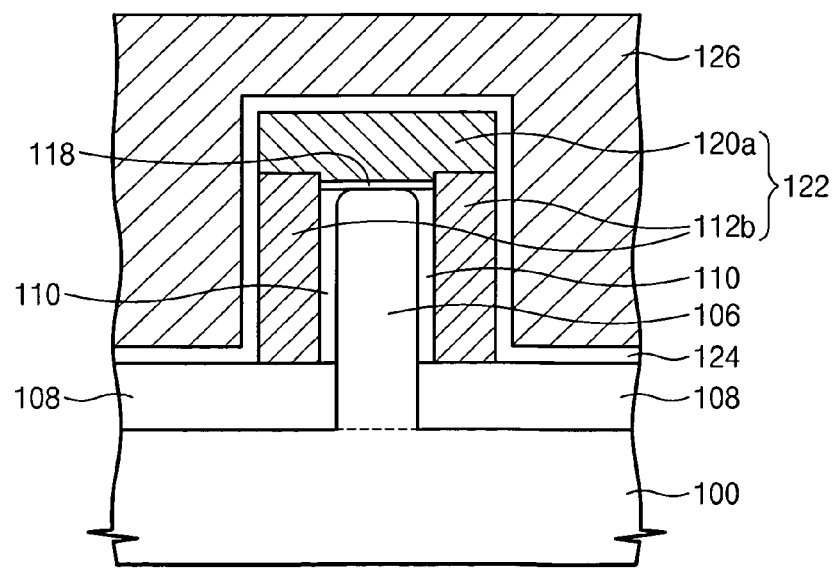
Figure 9C:
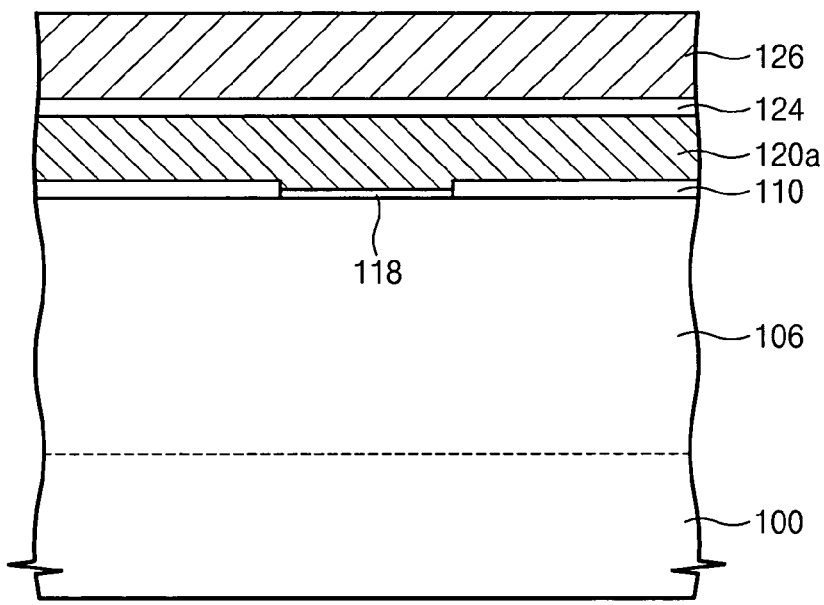
Figure 10A:
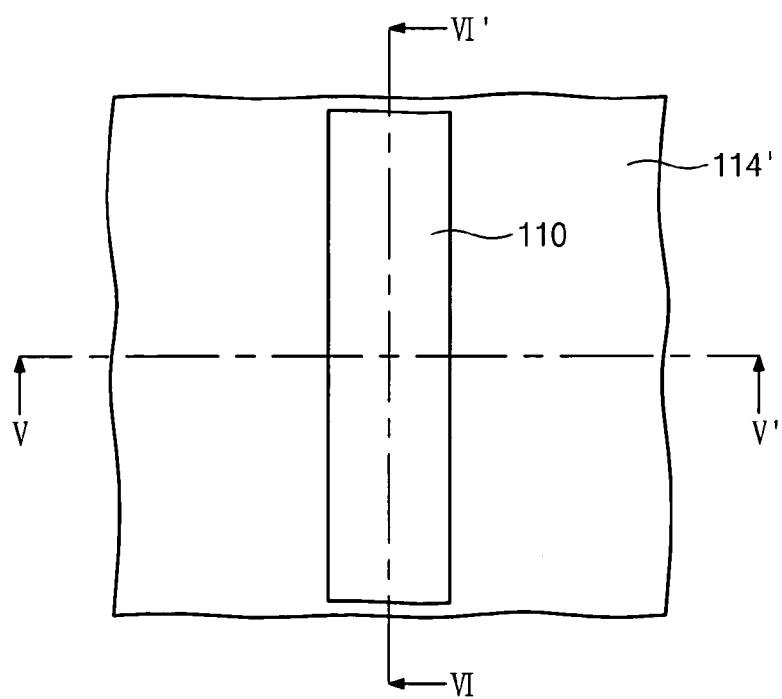
Figure 10B:
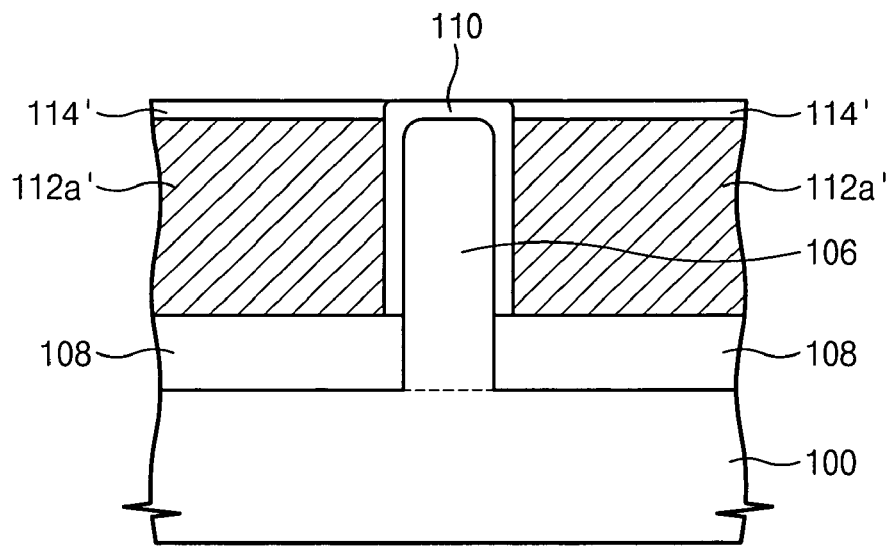
Figure 10C:
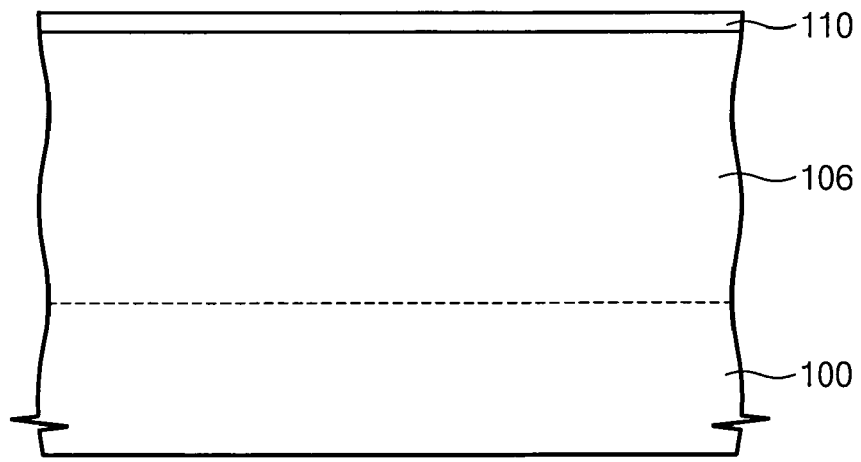

Subsequent processes may be carried out in the same manner as previously described with reference to FIG. 9A, FIG. 9B, and FIG. 9C. The subsequent processes include a process of successively patterning the second storage layer 120 and the recessed first storage layer 112a' to form a preliminary floating gate.

According to the above-described method, it is not necessary to perform a patterning process for forming an opening 116 described with reference to FIG. 6A, FIG. 6B, and FIG. 6C. The planarized oxidation barrier layer 114' is formed on the first storage layer 112a' recessed by self-alignment. A boundary of the second storage layer 120 and the recessed first storage layer 112a' may be as tall as the top surface of the fin 106. A second storage gate 120b of FIG. 2A, FIG. 2B, and FIG. 2C is in contact with an entire surface of a first storage gate 112c.

The substrate mentioned in the foregoing embodiments is a bulk substrate. However, the non-volatile memory device may be formed on a silicon-on-insulator (SOI) substrate, which will now be described with reference to FIG. 13A and FIG. 13B. In this case, the filling insulation pattern 108 may not be required.

Figure 13A:
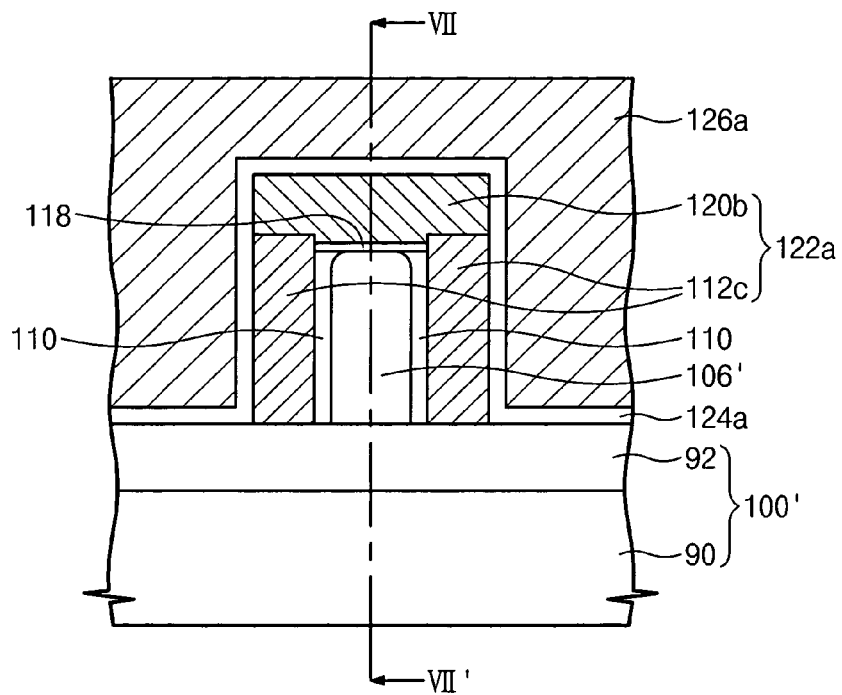
FIG. 13A is a cross-sectional view showing a modified version of the non-volatile memory device according to an embodiment of the present invention.
Figure 13B:
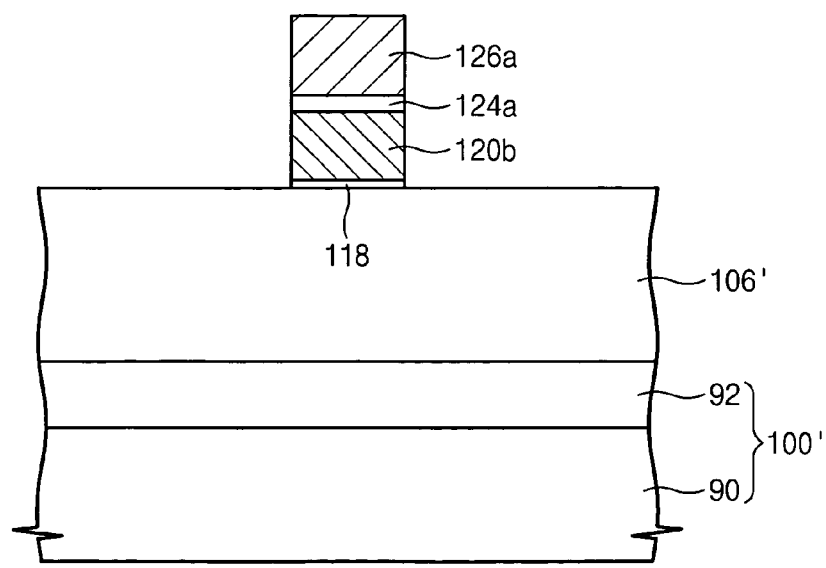
FIG. 13B is a cross-sectional view taken from a direction VII-VII' of FIG. 13A.

FIG. 13A is a cross-sectional view showing a modified version of the non-volatile memory device according to an embodiment of the present invention, and FIG. 13B is a cross-sectional view taken from a direction VII-VII' of FIG. 13A.

Referring to FIG. 13A and FIG. 13B, a substrate 100' includes a handling substrate 90 and a buried insulation layer 92 which are stacked in the order named. An upwardly protruding fin 106' is disposed on the buried insulation layer 92. The fin 106' includes a portion of a device layer of the substrate 100' that is a SOI substrate. Preferably, an upper corner of the fin 106' is rounded so as to prevent concentration of an electric field. A plan shape of the fin 106' may be a line shape, as illustrated in FIG. 2A. The buried insulation layer 90 may serve to isolate the device and to electrically isolate the device from the handling substrate 90.

A control gate electrode 126a is disposed to cross the fin 106'. A floating 122a is interposed between the control gate electrode 126a and the fin 106'. The floating gate 122a includes a first storage gate 112c and a second storage gate 120b. A first insulation layer 110 is interposed between the first storage gate 112c and a sidewall of the fin 106'. A second insulation layer 118 is interposed between the second storage gate 120b and a top surface of the fin 106'. A blocking insulation pattern 124a is interposed between the floating gate 122a and the control gate electrode 126a. An impurity doping layer 128 is disposed in the fin 106 on the opposite sides adjacent to the control gate electrode 126a.

The first and second insulation layers 110 and 118, the floating gate 122a, the control gate electrode 126a, the blocking insulation pattern 124a, and the impurity doping layer 128 may have the same characteristics as described above with reference to FIG. 2A, FIG. 2B, and FIG. 2C. Further, they may have the same shapes as illustrated in FIG. 2A.

The non-volatile memory device is disposed at the substrate 100' which is a SOI substrate, obtaining the effects described with reference to FIG. 2A, FIG. 2B, and FIG. 2C and enhancing a leakage current characteristic. As a result, a non-volatile memory device of more reduced power consumption may be constructed.

A method of forming the foregoing non-volatile memory device on a SOI substrate will now be described below.

Figure 14A:
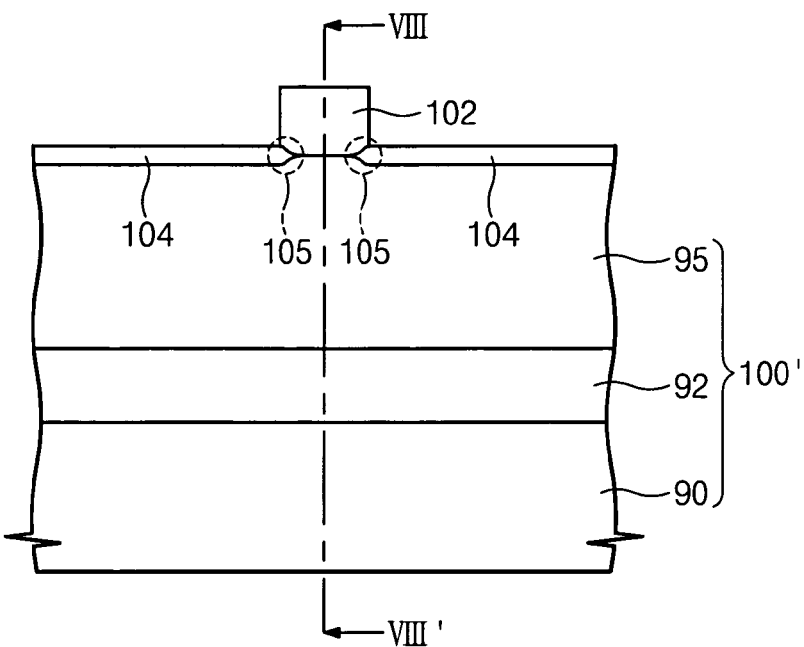
FIG. 14A and FIG. 15A are cross-sectional views for explaining a method of forming the modified version of the non-volatile memory device according to an embodiment of the present invention.
Figure 14B:
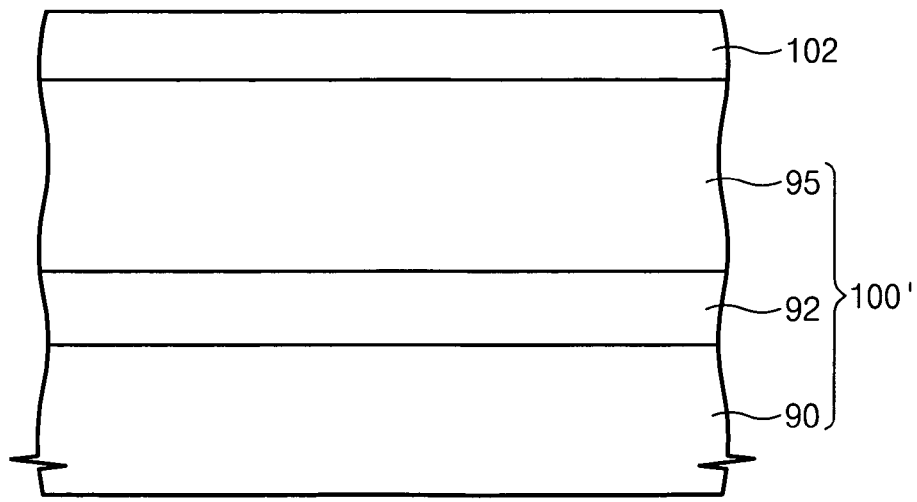
FIG. 14B and FIG. 15B are cross-sectional views taken from directions VIII-VIII' of FIG. 14A and FIG. 15A, respectively.
Figure 15A:
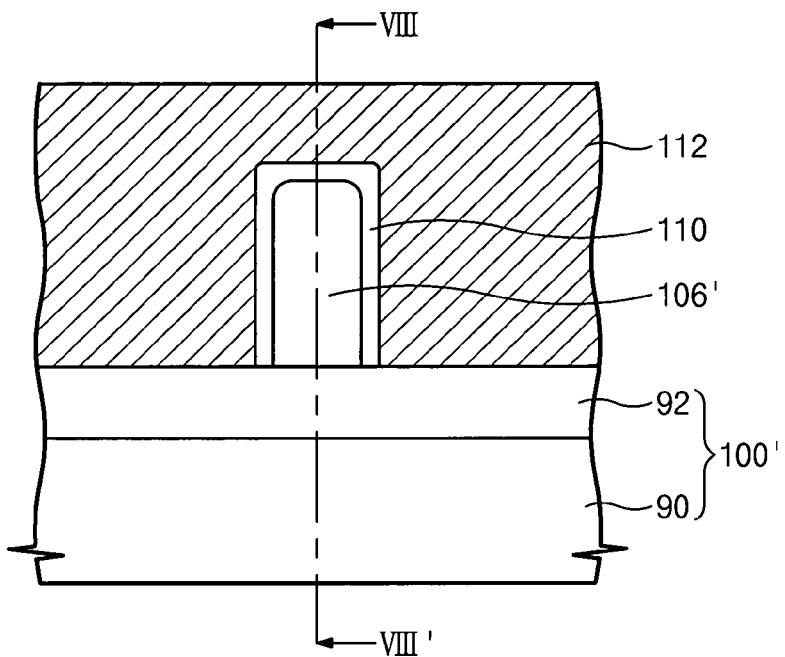
Figure 15B:
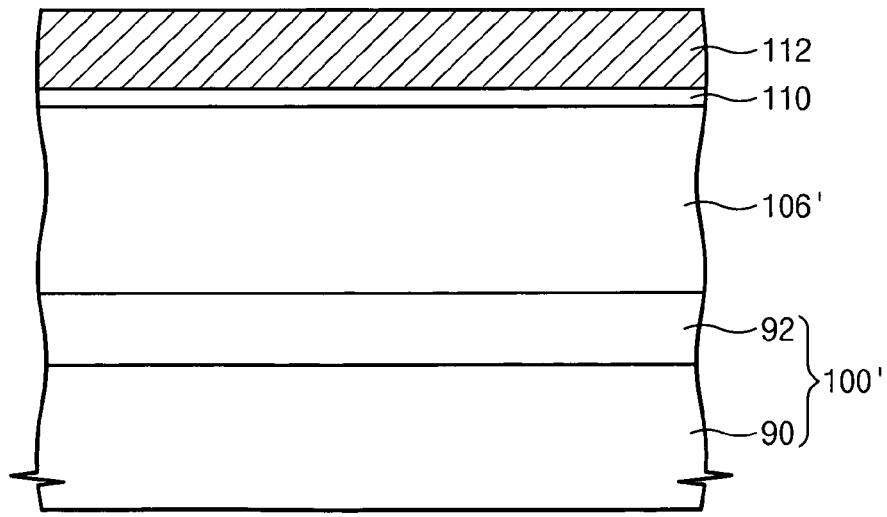

FIG. 14A and FIG. 15A are cross-sectional views for explaining a method of forming the modified version of the non-volatile memory device according to an embodiment of the present invention. FIG. 14B and FIG. 15B are cross-sectional views viewed from directions VIII-VIII' of FIG. 14A and FIG. 15A, respectively.

Referring to FIG. 14A and FIG. 14B, a mask pattern 102 is formed on a predetermined region of a substrate 100'. The substrate 100' is a SOI substrate including a handling substrate 90, a buried insulation layer 92, and a device layer which are stacked in the order named. As previously stated, the mask pattern 102 serves to prevent oxidation caused by the thermal oxidation process and has an etch selectivity with respect to the substrate 100'. Particularly, the mask pattern 102 has an etch selectivity with respect to the device layer 95. As described above, the mask pattern 102 may be a single layer made of silicon nitride or a multiple layer of silicon oxide/silicon nitride.

A substrate 100' including the mask pattern 102 is thermally oxidized to form a sacrificial thermal oxide layer 104. A bird's beak 105, which is an extending portion of the sacrificial thermal oxide layer 104, is formed below the edge of a bottom surface of the mask pattern 102.

Referring to FIG. 15A and FIG. 15B, using the mask pattern 102 as an etch mask, the sacrificial thermal oxide layer 104 and the device layer 95 of the substrate 100' are successively isotropically etched to form an upwardly protruding fin 106' on the substrate 100'. The fin 106' is formed on the buried insulation layer 92 of the substrate 100'. Undoubtedly, an upper corner of the fin 106' is rounded by the bird's beak 105. As previously stated, a thermal oxidation process may be carried out to cure the etch damage of the fin 106'.

A first insulation layer 110 is formed on the surface of the fin 106'. A first storage layer 112 is formed on the first insulation layer 110 to fill an etched portion of the substrate 100'. The first insulation layer 110 and the first storage layer 112 are the same as described above and will not be described in further detail.

Subsequent processes following formation of the first storage layer 112 may be carried out in the same manner as described with reference to FIG. 5A through FIG. 9A, FIG. 5B through FIG. 9B, and FIG. 5C through FIG. 9C. Alternatively, subsequent processes following the formation of the first storage 112 may be carried out in the same manner as described with reference to FIG. 10A through FIG. 12A, FIG. 10B through FIG. 12B, and FIG. 10C through FIG. 12C.

Other modifications and variations to the invention will be apparent to a person skilled in the art from the foregoing disclosure. Thus, while embodiments of the invention have been specifically described herein, it will be apparent that numerous modifications may be made thereto without departing from the spirit and scope of the invention.

What is claimed is:

1. A non-volatile memory device comprising:
   an upwardly protruding fin disposed on a substrate;
   a control gate electrode crossing the fin;
   a floating gate including a first storage gate and a second storage gate interposed between the control gate and the fin, the first storage gate disposed on a sidewall of the fin, and the second storage gate being disposed on a top surface of the fin and connected to the first storage gate;
   a first insulation layer and a second insulation layer, the first insulation layer interposed between the first storage gate and the sidewall of the fin, and the second insulation layer is thinner than the first insulation layer and interposed between the second storage gate and the top surface of the fin, wherein at a write or erase operation, the second insulation layer has a thickness sufficient to allow tunneling of charges and the first insulation layer has a thickness sufficient to suppress tunneling of charges; and
   a blocking insulation layer interposed between the control gate electrode and the floating gate.

2. The non-volatile memory device as recited in claim 1, wherein the first storage gate is made of a first doped polysilicon, and the second storage gate is made of a second doped polysilicon.

3. The non-volatile memory device as recited in claim 1, wherein an upper corner of the fin is rounded.

4. The non-volatile memory device as recited in claim 1, wherein the first and second insulation layers are made of thermal oxide.

5. The non-volatile memory device as recited in claim 1, wherein an outer sidewall of the first storage gate is aligned to a sidewall of the second storage gate.

6. The non-volatile memory device as recited in claim 1, further comprising a buried insulation layer disposed on the substrate, the fin being disposed on the buried insulation layer.

7. The non-volatile memory device as recited in claim 1, wherein the second storage gate is distinct from the first storage gate.

8. A non-volatile memory device comprising:
   an upwardly protruding fin disposed on a substrate;
   a control gate electrode crossing the fin;
   a floating gate including a first storage gate and a second storage gate interposed between the control gate and the fin, the first storage gate disposed on a sidewall of the fin, and the second storage gate being disposed on a top surface of the fin and connected to the first storage gate;
   a first insulation layer and a second insulation layer, the first insulation layer interposed between the first storage gate and the sidewall of the fin, and the second insulation layer is thinner than the first insulation layer and interposed between the second storage gate and the top surface of the fin; and a blocking insulation layer interposed between the control gate electrode and the floating gate, wherein the first storage gate is made of a first doped polysilicon, and the second storage gate is made of a second doped polysilicon, and wherein an impurity concentration of the first doped polysilicon is different from that of the second doped polysilicon.

9. The non-volatile memory device as recited in claim 8, wherein the impurity concentration of the first doped polysilicon is higher than that of the second doped polysilicon.

10. The non-volatile memory device as recited in claim 8, wherein at a write or erase operation, the second insulation layer has a thickness sufficient to allow tunneling of charges and the first insulation layer has a thickness sufficient to suppress tunneling of charges.

11. The non-volatile memory device as recited in claim 8, wherein an upper corner of the fin is rounded.

12. The non-volatile memory device as recited in claim 8, wherein the first and second insulation layers are made of thermal oxide.

13. The non-volatile memory device as recited in claim 8, wherein an outer sidewall of the first storage gate is aligned to a sidewall of the second storage gate.

14. The non-volatile memory device as recited in claim 8, further comprising a buried insulation layer disposed on the substrate, the fin being disposed on the buried insulation layer.

15. A non-volatile memory device comprising:

an upwardly protruding fin disposed on a substrate;

a control gate electrode crossing the fin;

a floating gate including a first storage gate and a second storage gate interposed between the control gate and the fin, the first storage gate disposed on a sidewall of the fin, and the second storage gate being disposed on a top surface of the fin and connected to the first storage gate;

a first insulation layer and a second insulation layer, the first insulation layer interposed between the first storage gate and the sidewall of the fin, and the second insulation layer is thinner than the first insulation layer and interposed between the second storage gate and the top surface of the fin;

a blocking insulation layer interposed between the control gate electrode and the floating gate; and a filling insulation pattern disposed on the substrate to surround a lower sidewall of the fin.

16. The non-volatile memory device as recited in claim 15, wherein the first storage gate is made of a first doped polysilicon, and the second storage gate is made of a second doped polysilicon.

17. The non-volatile memory device as recited in claim 16, wherein an impurity concentration of the first doped polysilicon is different from that of the second doped polysilicon.

18. The non-volatile memory device as recited in claim 17, wherein the impurity concentration of the first doped polysilicon is higher than that of the second doped polysilicon.

* * * * *